(12) United States Patent
Lee

(10) Patent No.: US 8,577,058 B2
(45) Date of Patent: *Nov. 5, 2013

(54) DISPLAY DEVICE AND DRIVING METHOD THEREOF

(75) Inventor: Ji-Yoon Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 692 days.

This patent is subject to a terminal disclaimer.

(21) Appl. No.: 12/622,635

(22) Filed: Nov. 20, 2009

(65) Prior Publication Data

US 2010/0310094 A1 Dec. 9, 2010

(30) Foreign Application Priority Data

Jun. 5, 2009 (KR) ........................ 10-2009-0050024

(51) Int. Cl.
  *G06K 9/46* (2006.01)
  *G06K 9/66* (2006.01)
  *H03G 3/00* (2006.01)
  *H04R 1/02* (2006.01)
  *H04R 9/06* (2006.01)

(52) U.S. Cl.
  USPC ............ 381/107; 381/104; 381/333; 382/194

(58) Field of Classification Search
  USPC ............ 382/194; 381/107, 306, 58, 104, 333; 345/204
  See application file for complete search history.

(56) References Cited

FOREIGN PATENT DOCUMENTS

| JP | 04-014084 | 1/1992 |
|----|-----------|--------|
| JP | 05-002483 | 1/1993 |
| JP | 06-118922 | 4/1994 |
| JP | 2000-115649 | 4/2000 |
| JP | 2003-131659 | 5/2003 |
| JP | 2003-271164 | 9/2003 |
| JP | 2007-134930 | 5/2007 |
| JP | 2007-147731 | 6/2007 |

(Continued)

OTHER PUBLICATIONS

Translation of JP 2003-131659 from PAJ website, Jun. 3, 2012.*
Definition of Luminosity excerpt from merriam-webster.com, "http://www.merriam-webster.com/dictionary/luminosity", 1 page, captured Nov. 29, 2012.*
U.S. Appl. No. 12/626,706, filed Nov. 27, 2009, Ji-Yoon Lee, Samsung Mobile Display Co., Ltd.

(Continued)

*Primary Examiner* — Vivian Chin
*Assistant Examiner* — Douglas Suthers
(74) *Attorney, Agent, or Firm* — Christie, Parker & Hale, LLP

(57) ABSTRACT

A display device and a method of driving the display, wherein the volume of background music is controlled depending upon the color or brightness of display images, and the power consumption is reduced. The display device includes a display unit with a plurality of pixels, a signal controller, and a volume controller. The display unit displays images by selectively activating pixels from among the plurality of pixels in accordance with input video signals and input image control signals. The signal controller reads the input video signals to generate on-pixel signals having information about the ratio of a number of the active pixels compared to a total number of pixels in the plurality of pixels per each frame. The volume controller determines a range from among predetermined ratio ranges corresponding to the ratio of the number of active pixels to define a plurality of volume levels, and determine the volume level corresponding to the on-pixel signal to control the volume according to the ratio corresponding to the determined volume level.

16 Claims, 3 Drawing Sheets

(56) References Cited

FOREIGN PATENT DOCUMENTS

| | | |
|---|---|---|
| JP | 2007-148064 | 6/2007 |
| JP | 2008-009443 | 1/2008 |
| JP | 2008-170970 | 7/2008 |
| JP | 2008-233830 | 10/2008 |
| JP | 2008-293042 | 12/2008 |
| KR | 10-1997-0000601 | 1/1997 |
| KR | 10-1997-0025046 | 5/1997 |

OTHER PUBLICATIONS

U.S. Office action dated Dec. 4, 2012, for cross reference U.S. Appl. No. 12/626,706, (12 pages).

* cited by examiner

DISPLAY DEVICE AND DRIVING METHOD THEREOF

CROSS-REFERENCE TO RELATED APPLICATION

This application claims the benefit of Korean Patent Application No. 10-2009-0050024, filed Jun. 5, 2009, in the Korean Intellectual Property Office, the disclosure of which is incorporated herein by reference.

BACKGROUND OF THE INVENTION

1. Field of the Invention

The described technology relates generally to a display device and a driving method thereof, and more particularly, to an organic light emitting diode (OLED) display and a method of driving the same.

2. Description of the Related Art

A display device has a display area including a plurality of pixels arranged on a substrate in the form of a matrix and scan and data lines connected to the respective pixels. Data signals are selectively applied to the pixels to display desired images. The display devices are classified into passive and active matrix types, depending upon the method of driving the pixels. Because of display resolution, contrast and response time, the current trend is towards using the active matrix type display device where respective unit pixels selectively turn on or off.

The display device is used as a display unit for a personal computer, a portable phone, a PDA, and other mobile information devices, or as a monitor for various kinds of information systems. A liquid crystal panel-based LCD, an organic light emitting diode (OLED) display, a plasma panel-based PDP, etc., are well known. Various kinds of emissive display devices, which are lighter in weight and volume than CRTs, have been recently developed, and particularly, the OLED display has come to the forefront as it provides increases in emissive efficiency, luminance, and viewing angle, and has a short response time.

The above information disclosed in this Background section is only for enhancement of understanding of the background of the described technology and therefore it may contain information that does not form the prior art that is already known in this country to a person of ordinary skill in the art.

SUMMARY OF THE INVENTION

Aspects of the present invention provide a display device and a driving method thereof having advantages of controlling the volume of background music depending upon the color or brightness of display images, and reducing the power consumption.

Aspects of the present invention provide a display device including a display unit having a plurality of pixels, a signal controller, and a volume controller. The display unit displays images by selectively activating pixels from among the plurality of pixels in accordance with input video signals and input image control signals. The signal controller reads the input video signals to generate on-pixel signals having information about a ratio of a number of the active pixels compared to a total number of pixels in the plurality of pixels per each frame. The volume controller determines a range from among predetermined ratio ranges corresponding to the ratio of the number of active pixels to define a plurality of volume levels, and determining the volume level corresponding to the on-pixel signal to control the volume according to the ratio corresponding to the detected volume level. The volume controller maintains a constant volume until the ratio of the active pixels reaches a predetermined reference value. The volume controller reduces the volume level-by-level based on the maintained volume until the ratio of the active pixels reaches the predetermined reference value.

In a method of driving a display device according to an exemplary embodiment, a plurality of pixels are selectively activated in accordance with input video signals and input image control signals so as to display images. The input video signals are read so as to generate on-pixel signals having information about the ratio of the number of active pixels to the total number of pixels in the plurality of pixels per each frame. The ratio of the number of active pixels is determined to correspond to a range from among predetermined ratio ranges to define a plurality of volume levels, the volume level corresponding to the on-pixel signal is determined, and the volume is controlled according to the ratio corresponding to the detected volume level. The volume is maintained constant until the ratio of the active pixels reaches a predetermined reference value. With the volume controlling, the volume is reduced level-by-level based on the maintained volume until the ratio of the active pixels reaches the predetermined reference value.

According to aspects of the present invention, the volume of background music is controlled according to the color or brightness of the display images so that the power consumption can be reduced.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
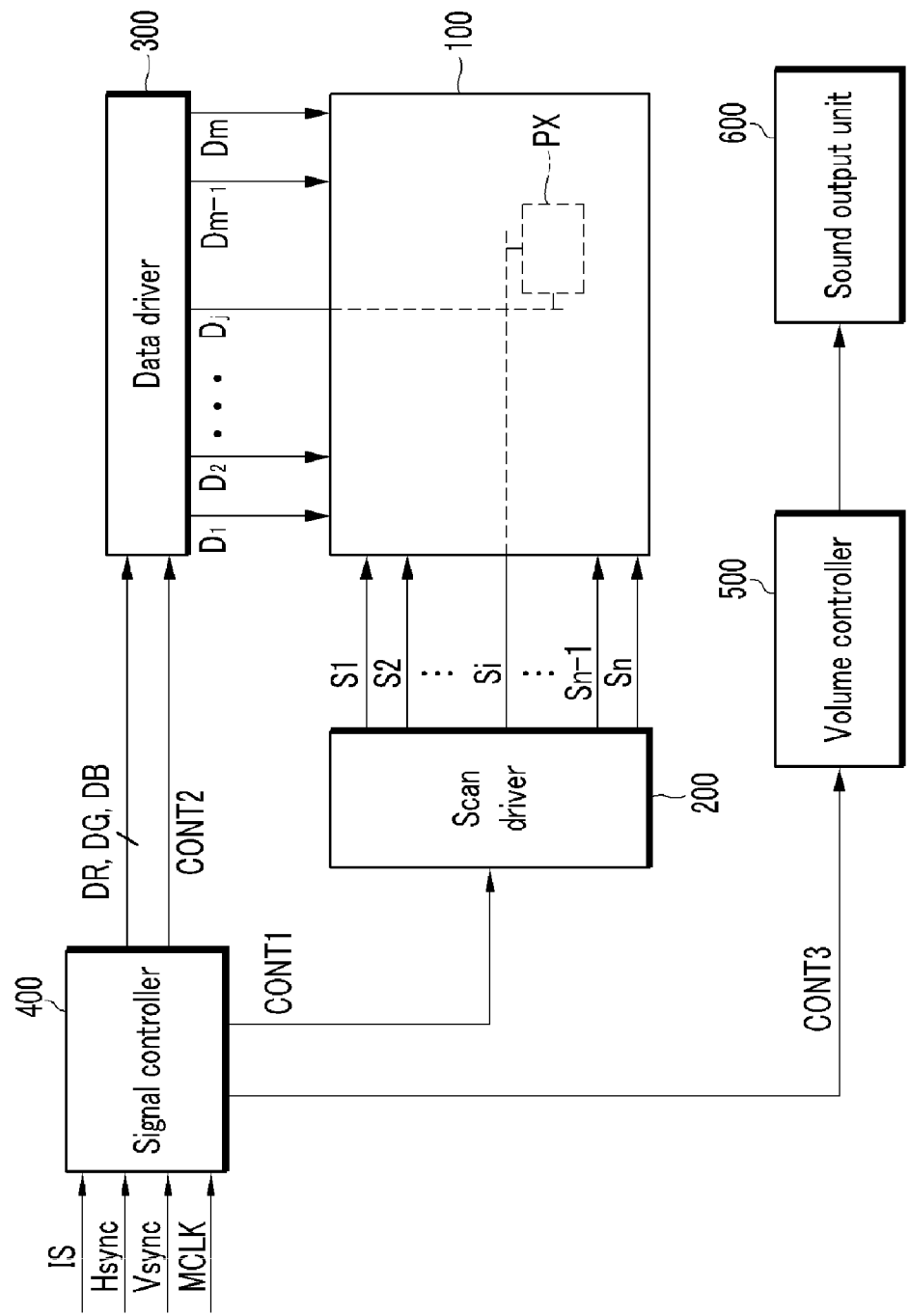
FIG. 1 is a block diagram of a display device according to an exemplary embodiment.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Herein, when a first element is described as being connected to a second element, the first element may be directly connected to the second element or may be electrically connected or indirectly connected to the second element via a third element.

Figure 2:
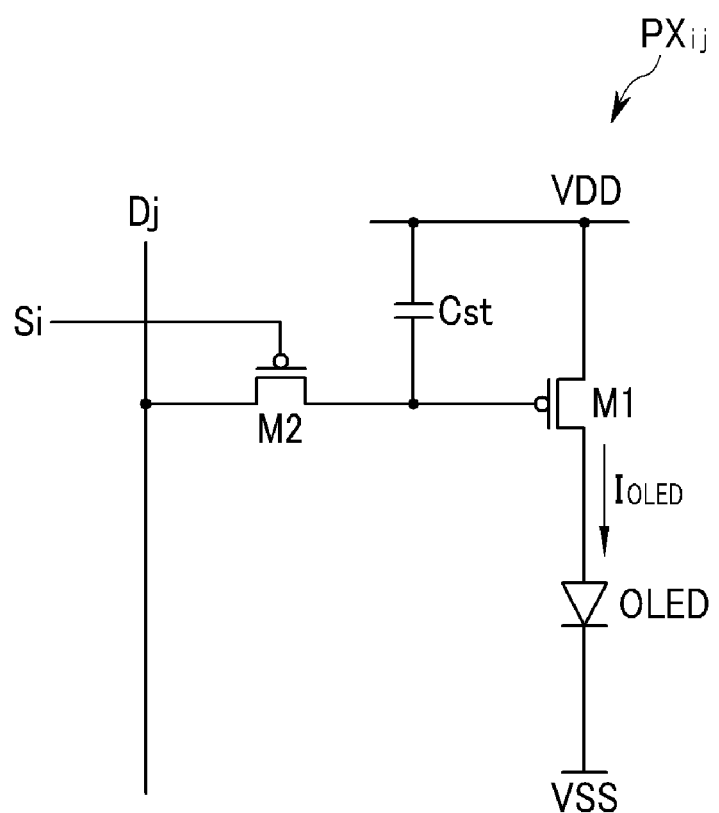
FIG. 2 is an equivalent circuit diagram of the pixel PX shown in FIG. 1.

FIG. 1 is a block diagram of a display device according to an exemplary embodiment, and FIG. 2 is an equivalent circuit diagram of the pixel PX shown in FIG. 1. Referring to FIG. 1, a display device according to an exemplary embodiment includes a display unit 100, a scan driver 200, a data driver 300, a signal controller 400, a volume controller 500, and a sound output unit 600. From the viewpoint of an equivalent circuit, the display unit 100 includes a plurality of signal lines S1 to Sn and D1 to Dm, and a plurality of pixels PX connected to those signal lines and arranged roughly in the form of a matrix. The signal lines S1 to Sn and D1 to Dm include a plurality of scan lines S1 to Sn for transmitting scan signals, and a plurality of data lines D1 to Dm for transmitting data voltages. The scan lines S1 to Sn extend roughly in the pixel row direction and are substantially parallel to each other, and the data lines D1 to Dm extend roughly in the pixel column direction and are substantially parallel to each other. Referring to FIG. 2, the pixel PXij, which is representative of the pixel PX illustrated in FIG. 1, is connected to the i-th (i=1, 2, . . . , n) scan line Si and the j-th (j=1, 2, . . . , m) data line Dj, and includes an organic light emitting element OLED, a driving transistor M1, a capacitor Cst, a switching transistor M2, and an emission control transistor M3.

The driving transistor M1 has a control terminal, an input terminal, and an output terminal. The control terminal of the driving transistor M1 is connected to the switching transistor M2, the input terminal of the driving transistor M1 is connected to the driving voltage VDD, and the output terminal of the driving transistor M1 is connected to the organic light emitting element OLED. The driving transistor M1 outflows an electric current IOLED, which has a varied amperage corresponding to the voltage difference between the control and output terminals.

The switching transistor M2 has a control terminal, an input terminal, and an output terminal. The control terminal of the switching transistor M2 is connected to the scan line Si, the input terminal of the switching transistor M2 is connected to the data line Dj, and the output terminal of the switching transistor M2 is connected to the driving transistor M1. The switching transistor M2 transmits a data signal, that is, a data voltage applied to the data line Dj, to the control terminal of the driving transistor M1 in response to the scan signal applied to the scan line Si.

The capacitor Cst is connected between the control and input terminals of the driving transistor M1. The capacitor Cst stores the data voltage applied to the control terminal of the driving transistor M1, and stores it even after the switching transistor M2 turns off.

The organic light emitting element OLED may be an organic light emitting diode (OLED), and has an anode connected to the output terminal of the driving transistor M1 and a cathode connected to a common voltage VSS. The organic light emitting element OLED emits light that is varied in intensity, depending upon the electric current IOLED supplied from the driving transistor M1.

The organic light emitting elements OLED may emit light of one of the primary colors red, green, and blue, and the desired color may be expressed by a spatial or temporal sum of the three primary colors. Some of the organic light emitting elements OLED may emit light of a white color so as to heighten the luminance. Alternatively, the organic light emitting elements OLED of each of the respective pixels PX of the display unit 100 may emit light of a white color, and in this case, some of the pixels PX may further include a color filter (not shown) for converting the white-colored light from the organic light emitting elements OLED into any one of the primary colors.

The driving transistor M1 and the switching transistor M2 are each a p-channel field effect transistor (FET). In this case, the control terminal, the input terminal, and the output terminal correspond to the gate, the source, and the drain, respectively. However, at least one of the switching transistor M2 and the driving transistor M1 may be an n-channel field effect transistor. Furthermore, the transistors M1 and M2, the capacitor Cst, and the organic light emitting element OLED may be changed in interconnection. The pixel PXij shown in FIG. 2 illustrates a pixel of a display device, and another pixel having a different structure with at least two transistors or at least one capacitor may be used instead.

Referring to FIG. 1 again, the scan driver 200 is connected to the scan lines S1 to Sn of the display unit 100, and sequentially applies scan signals to the scan lines S1 to Sn in accordance with the scan control signals CONT1. The scan signals include a gate-on voltage Von (not shown) for turning on the switching transistor M2, and a gate-off voltage Voff (not shown) for turning off the switching transistor M2. If the switching transistor M2 is a p-channel field effect transistor, the gate-on voltage Von and the gate-off voltage Voff are low and high voltages, respectively.

The data driver 300 is connected to the data lines D1 to Dm of the display unit 100, and converts the data signals DR, DG, and DB that are input from the signal controller 400 into data voltages in accordance with the data control signals CONT2 so as to apply them to the data lines D1 to Dm.

The signal controller 400 receives input signals IS, horizontal synchronization signals Hsync, vertical synchronization signals Vsync, and main clock signals MCLK from the outside, and generates image data signals DR, DG, and DB, scan control signals CONT1, data control signals CONT2, and sound control signals CONT3. The scan control signals CONT1 include a scan start signal STV, and at least one clock signal for controlling the output cycle of the gate-on voltage Von. The scan control signals CONT1 may further include an output enable signal OE for defining the duration of the gate-on voltage Von. The data control signals CONT2 include horizontal synchronization start signals STH for starting the transmission of image data signals DR, DG, and DB, which correspond to a row of pixels PX, to the data driver 300, and load signals LOAD for applying data voltages to the data lines D1 to Dm. The volume control signals CONT3 include on-pixel signals (OPS) containing information about the number of active pixels for one frame. The on-pixel signal (OPS) represents a percent ratio of the number of active pixels compared to the total number of pixels in the display unit 100. For example, if the total number of pixels in the display unit 100 is 100, the on-pixel signal (OPS) is generated at 10% when the number of active pixels for one frame is 10.

The volume controller 500, which controls the audio output of the display device as an audio controller, determines the ratio of the number of active pixels PX to the total number of pixels volume level-by-level, and detects the volume level corresponding to the on-pixel signals (OPS). The volume controller 500 controls the volume such that it is reduced by the ratio corresponding to the volume level corresponding to the on-pixel signal (OPS). According to the present exemplary embodiment, the volume controller 500 determines which of four volume levels corresponds to the ratio of the number of active pixels to the total number of pixels PX. That is, a first volume level demarcates the ratio of the number of active pixels to the total number of pixels PX in a range from 60% to less than 70%. A second volume level demarcates the ratio of the number of active pixels PX to the total number of pixels PX in a range from 70% to less than 80%. A third volume level demarcates the ratio of the number of active pixels PX to the total number of pixels PX in a range from 80% to less than 90%, and a fourth volume level demarcates the ratio of the number of active pixels PX to the total number of pixels PX in a range from 90% to 100%. However, aspects of the present invention are not limited thereto, and the ratio range of the number of active pixels may be varied so that the number of volume levels may increase or decrease. The volume controller 500 reduces the volume by a predetermined ratio as the volume level goes up, based on the reference volume. According to an exemplary embodiment, the volume is reduced by 10% at the first volume level, by 15% at the second volume level, by 20% at the third volume level, and by 30% at the fourth volume level. Furthermore, the volume is maintained to be constant when the ratio of the number of active pixels to the total number of pixels is in a range from 0% to 60%, and this volume is defined as a reference volume. However, it is understood that aspects of the present invention are not limited thereto, and the range of the reference volume may be varied in accordance with the ranges for the volume levels for the percent ratio of the active pixels PX. Furthermore, the volume control ratio per respective level may increase or decrease in accordance with the power consumption.

The sound output unit 600 controls the volume of the sound in accordance with the outputs of the volume controller 500 and outputs the volume-controlled sound.

Figure 3:
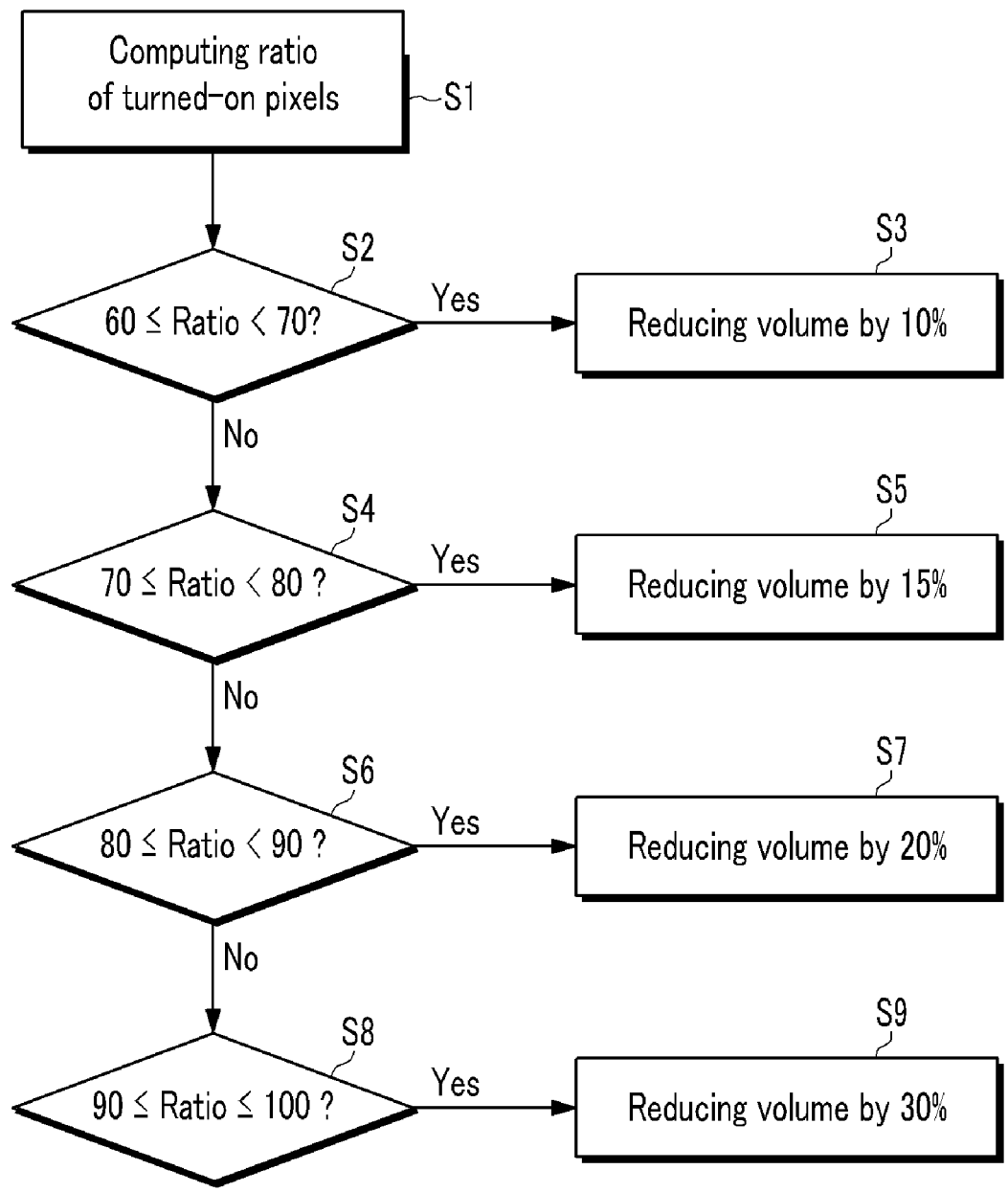
FIG. 3 is a flowchart illustrating a method of driving a display device according to an exemplary embodiment.

FIG. 3 is a flowchart illustrating a method of driving a display device according to an exemplary embodiment.

Referring to FIG. 3, the signal controller 400 detects the number of active pixels PX per each frame from the input signals IS, and computes the ratio of the number of active pixels PX to the number of all of the pixels PX with a first operation S1. The computed ratio is output as the on-pixel signal (OPS). Thereafter, the volume controller 500 detects the level corresponding to the ratio computed at the first operation S1. Specifically, the volume controller 500 determines whether the ratio computed at the first operation S1 is in the range of 60% to less than 70% with a second operation S2. When it is determined that the ratio computed at the first level S1 is in that range, the volume controller 500 controls the volume such that the output volume is reduced by 10% of the reference volume with a third operation S3. When the ratio computed at the first operation S1 is not in that range, a fourth operation S4 is executed. In the operation S4, the volume controller 500 determines whether the ratio computed at the first operation S1 is in the range of 70% to less than 80%. When it is determined that the ratio computed at the first operation S1 is in that range, the volume controller 500 controls the volume such that the output volume is reduced by 15% of the reference volume with a fifth operation S5. When the ratio computed at the first operation S1 is not in that range, a sixth operation S6 is executed. In the operation S6, the volume controller 500 determines whether the ratio computed at the first operation S1 is in the range of 80% to less than 90%. When it is determined that the ratio computed at the first operation S1 is in that range, the volume controller 500 controls the volume such that the output volume is reduced by 20% of the reference volume, with a seventh operation S7. When the ratio computed at the first operation S1 is not in that range, an eighth operation S8 is executed. In the operation S8, the volume controller 500 determines whether the ratio computed at the first operation S1 is in the range of 90% to 100%. When it is determined that the ratio computed at the first operation S1 is in that range, the volume controller 500 controls the volume such that the output volume is reduced by 30% of the reference volume, with a ninth operation S9.

According to the exemplary embodiment described above, with a display device and a driving method thereof, when the ratio of the active pixels computed per-frame from the image signal increases, the volume is reduced level-by-level so that power consumption can be decreased.

Although a few embodiments of the present invention have been shown and described, it would be appreciated by those skilled in the art that changes may be made in this embodiment without departing from the principles and spirit of the invention, the scope of whic is defined in the claims and their equivalents.

What is claimed is:

1. A display device comprising:
   a display unit comprising a plurality of pixels to display images by selectively activating pixels from among the plurality of pixels in accordance with input video signals and input image control signals;
   a signal controller reading the input video signals to generate on-pixel signals having information about a ratio of a number of active pixels to a total number of pixels in the plurality of pixels per each frame; and
   a volume controller determining a range from among predetermined ratio ranges corresponding to the ratio to define a plurality of volume levels, for determining a volume level corresponding to the on-pixel signal to control a volume of sound output unit according to the ratio corresponding to the determined volume level, and for maintaining a constant volume until the ratio reaches a first predetermined reference value.

2. The display device of claim 1, wherein the volume controller is configured to incrementally reduce the volume of the sound output unit until the ratio reaches a second predetermined reference value.

3. The display device of claim 1, wherein the sound output unit is for outputting sound controlled by the volume controller.

4. A method of driving a display device, the method comprising:
   activating a plurality of pixels selectively in accordance with input video signals and input image control signals so as to display images;
   reading the input video signals so as to generate on-pixel signals having information about a ratio of the number of active pixels to the total number of pixels in the plurality of pixels per each frame;
   determining a range from among predetermined ratio ranges corresponding to the ratio to define a plurality of volume levels;
   determining a volume level corresponding to the on-pixel signals;
   controlling audio volume according to the ratio corresponding to the determined volume level; and
   maintaining the audio volume to be constant until the ratio reaches a first predetermined reference value.

5. The method of claim 4, wherein with the audio volume controlling, the audio volume is reduced incrementally until the ratio reaches a second predetermined reference value.

6. A display device including a display unit having a plurality of pixels to display images according to input video signals and input image control signals, the display device comprising:
   a signal controller determining a number of activated pixels per each frame displayed on the display unit according to the input video signals, and for calculating an on-pixel ratio of the number of activated pixels per each frame to a total number of pixels of the pluarlity of pixels; and
   a volume controller for controlling audio volume of the display device according to the number of activated pixels.

7. The display device of claim 6, wherein the volume controller configures to receive the on-pixel ratio from the signal controller to control the audio volume of the display device.

8. The display device of claim 7, wherein the volume controller is configured to determine a plurality of volume levels according to predetermined ranges corresponding to the number of activated pixels per each frame and is configured to determine the volume level corresponding to the on-pixel ratio.

9. The display device of claim 8, wherein the volume controller is configured to maintain a first volume level corresponding to a first predetermined range until the volume controller determines a second volume level corresponding to the on-pixel ratio.

10. The display device of claim 9, wherein the volume controller is configured to reduce the volume level-by-level from the first volume level to the second volume level corresponding to the on-pixel ratio.

11. The display device of claim 10, further comprising a sound output unit for outputting sound according the volume controller.

12. A method of controlling audio volume of a display device, the method comprising:

determining a number of activated pixels for a frame displayed on a display unit of the display device according to input video signals by calculating an on-pixel ratio of the number of activated pixels to a number of total pixels of the display unit; and controlling the audio volume of the display device according to the number of activated pixels.

13. The method of claim 12, wherein the controlling the audio volume of the display device according to the number of activated pixels comprises controlling the audio volume according to the on-pixel ratio.

14. The method of claim 12, further comprising:

determining a plurality of volume levels according to predetermined ranges corresponding to the number of activated pixels per each frame; and determining the volume level corresponding to the calculated on-pixel ratio.

15. The method of claim 14, further comprising:

maintaining a first volume level corresponding to a first predetermined range until a second volume level corresponding to the on-pixel ratio is determined; and reducing the volume level-by-level from the first volume level to the second volume level corresponding to the on-pixel ratio.

16. The method of claim 15, further comprising outputting sound according the volume level.

* * * * *